(12) United States Patent
Murata et al.

(10) Patent No.: US 8,622,682 B2
(45) Date of Patent: Jan. 7, 2014

(54) STORAGE, STORAGE SET AND TRANSPORTING SYSTEM

(75) Inventors: Masanao Murata, Ise (JP); Takashi Yamaji, Ise (JP)

(73) Assignee: Murata Machinery, Ltd., Kyoto-shi (JP)

( * ) Notice: Subject to any disclaimer, the term of this patent is extended or adjusted under 35 U.S.C. 154(b) by 704 days.

(21) Appl. No.: 12/253,291

(22) Filed: Oct. 17, 2008

(65) Prior Publication Data

US 2009/0104006 A1    Apr. 23, 2009

(30) Foreign Application Priority Data

Oct. 18, 2007   (JP) ................................. 2007-271382

(51) Int. Cl.
*B65G 1/00* (2006.01)

(52) U.S. Cl.
USPC .......................................... 414/281; 414/940

(58) Field of Classification Search
USPC .................. 414/935, 266, 267, 277, 281, 940
See application file for complete search history.

(56) References Cited

U.S. PATENT DOCUMENTS

| | | | | |
|---|---|---|---|---|
| 5,464,313 | A * | 11/1995 | Ohsawa ........................ | 414/172 |
| 5,980,183 | A * | 11/1999 | Fosnight ................... | 414/222.01 |
| 6,379,096 | B1 * | 4/2002 | Beutler et al. ................ | 414/281 |
| 6,506,009 | B1 * | 1/2003 | Nulman et al. ............ | 414/217.1 |
| 6,739,820 | B2 * | 5/2004 | Chang et al. ............... | 414/217.1 |
| 7,234,908 | B2 * | 6/2007 | Nulman et al. ........... | 414/222.01 |
| 7,243,003 | B2 * | 7/2007 | Rice et al. ..................... | 700/245 |
| 7,356,378 | B1 * | 4/2008 | Huang et al. .................. | 700/112 |
| 7,578,650 | B2 * | 8/2009 | Aalund et al. ................. | 414/806 |
| 7,637,707 | B2 * | 12/2009 | Perlov et al. ............. | 414/222.01 |
| 7,695,234 | B2 * | 4/2010 | Yamashita .................... | 414/277 |
| 7,912,576 | B2 * | 3/2011 | Rice et al. ..................... | 700/230 |
| 2003/0099527 | A1 * | 5/2003 | Mitsuyoshi ................... | 414/217 |
| 2004/0042878 | A1 * | 3/2004 | Watanabe et al. ......... | 414/222.02 |
| 2004/0149672 | A1 * | 8/2004 | Motoori et al. ............... | 212/332 |
| 2005/0036856 | A1 * | 2/2005 | Yamashita .................... | 414/277 |
| 2005/0191162 | A1 * | 9/2005 | Chang et al. .................. | 414/626 |

FOREIGN PATENT DOCUMENTS

| | | |
|---|---|---|
| EP | 1134641 | 8/2003 |
| JP | 05-047896 | 2/1993 |
| JP | 06-239422 | 8/1994 |
| JP | 07-196108 | 8/1995 |

(Continued)

OTHER PUBLICATIONS

Official Action issued on Sep. 19, 2011 by the Chinese Patent Office in Chinese Application No. 200810169049.4, 1 page.

(Continued)

*Primary Examiner* — Joshua Rudawitz

(74) *Attorney, Agent, or Firm* — Young & Thompson

(57) ABSTRACT

A storage (10) unloads and loads a load (3) with a transporting carriage (2). The storage is provided with a port capable of transferring said load from or to said transporting carriage; a plurality of rack portions (15) capable of accommodating or putting said load thereon; a driving device (19) capable of moving said load between said port and said plurality of rack portions, and mutually between said plurality of rack portions; and a controlling device (20) for controlling said driving device to (i) firstly move said load to an temporary rack portion for unloading, which is one of said plurality of rack portions, and (ii), after once accommodating or putting said load on said temporary rack portion, move said load to said port from said temporary rack portion, in case of moving said load from said plurality of rack portions to said port.

2 Claims, 7 Drawing Sheets

(56) References Cited

FOREIGN PATENT DOCUMENTS

| | | |
|---|---|---|
| JP | 9-315521 | 12/1997 |
| JP | 10-250836 | 9/1998 |
| JP | 11-310306 | 11/1999 |
| JP | 2000-91401 | 3/2000 |
| JP | 2001-002208 | 1/2001 |
| JP | 2002-231785 | 8/2002 |
| JP | 2003-150247 | 5/2003 |
| JP | 2003-182815 | 7/2003 |
| JP | 2004-238191 | 8/2004 |
| JP | 2006-049454 | 2/2006 |
| JP | 2007-022677 | 2/2007 |
| JP | 2007-186320 | 7/2007 |
| TW | 200535076 | 11/2005 |
| TW | 200737392 | 10/2007 |

OTHER PUBLICATIONS

Official Action issued on Sep. 19, 2011 by the Chinese Patent Office in Chinese Application No. 200810213476.8, 1 page.

* cited by examiner

STORAGE, STORAGE SET AND TRANSPORTING SYSTEM

BACKGROUND OF THE INVENTION

1. Field of the Invention

The present invention relates to a storage, a storage set assembled by a plurality of such storages, and a transporting system including the storage, wherein the storage such as a stocker for temporarily storing a load (i.e., a transported object or an object), such as a FOUP (Front Opening Unified Pod) for accommodating or housing various substrates for manufacturing semiconductor elements and the like, at the position located close to a track, in a traveling system for transporting the load on the track. Here, the "load" (i.e., a transported object or an object) in the present invention means a product, an intermediate product, a part, an article, a work, a partly-finished good, a good or the like (e.g, a semiconductor or LCD device), or means a box or container for containing such a product or the like (e.g, a container containing the semiconductor or LCD device), which has been transported or is to be transported by the transporting carriage. The load may be a carrier for containing an object to be carried such as a FOUP.

2. Description of the Related Art

This kind of storage is installed close to a track on which a transporting carriage such as a vehicle travels for example. In the storage, a lot of rack portions are installed so as to store a lot of loads which are transported or to be transported by the transporting carriage. Further, a transporting apparatus in a storage, which is called as a "stacker robot", a "stacker crane" or the like, is provided to perform the transportation of the load between a "port" and the assigned or designated rack portion (i.e., to perform transportation within the storage). The "port" is to perform the delivery-and-receipt or the taking-out and putting-in of the load (i.e., loading and unloading of the load) between the inside of such a storage and the transporting carriage. Especially, the transportation within the storage including a lot of rack portions arranged crisscross is made possible by the stacker robot or the like. For example, the unloading and loading, and storing a lot of loads (i.e., the loads between several dozen and several hundreds) are made possible. A large scale storage weighing between several tons and several dozen of tons is also put into practice (refer to Japanese Patent Application Publication Laying Open No. 2006-049454 and 2003-182815).

On the other hand, as this kind of storage, there is a storage, which is relatively compact, and in which a load is directly transferred (i.e., loaded and unloaded) from a transporting carriage of ceiling hanging type onto a rack stage capable of going up and down along the side of rack portions, which are vertically arranged by a plurality of levels. In this storage, when a load is unloaded (i.e., taken-out from the storage), the load is directly transferred from the rack stage capable of going up and down, to the transporting carriage (refer to Japanese Patent Application Publication Laying Open No. 2004-238191).

SUMMARY OF THE INVENTION

However, according to the storage in each of the above described related arts NO. 2006-049454 and 2003-182815, after a transporting carriage having no load arrives, if a load to be unloaded is transported within a storage from a rack portion on which the load is stored or kept, to a port, especially, depending on the position of the rack portion, it takes a certain time period to transport within the storage. Or, in case that the load is put on the load to be unloaded in advance, it is convenient that the arrived transporting carriage is having no load, but there is a possibility that the transporting carriage is having a load. Then, to avoid such an inconvenience, controlling over the whole thing is also possible theoretically by setting up a detailed schedule about the transfer of the load by the transporting carriage. However, since as a plurality of transporting carriages, each of which travels at a high speed on a track united intricately, a plurality of loads, the use condition (i.e., especially, the crowed condition and the traffic jam) of the track, the port or a stacker robot, and the like relate deeply as parameters, there is a technical problem that the practical control is extremely difficult.

On the other hand, according to the storage in the above described related art No. 2004-238191, the going up and down rack stage itself becomes a port for unloading and loading. Thus, when loading, it takes a certain time period to hang a load down from a transporting carriage, position the hung load until the going up and down rack stage and put the positioned load down. When unloading, it takes a certain time period to hang a load up from the going up and down rack stage by a transporting carriage. Especially, if the going up and down rack stage is not set at the position for taking-out and putting-in, which is at the upper position, it takes a certain time period to move the going up and down rack stage up to the position. Alternatively, it is difficult to take out and put in the load on the going up and down rack stage which is at the lower position. Especially, by the operation for unloading and loading requiring the certain time period in this manner, the going up and down rack stage is exclusively occupied or used. Therefore, there is a technical problem that it is not possible to transport other load in the storage by use of the going up and down rack stage.

It is therefore an object of the present invention to provide a storage, a storage set assembled by a plurality of such storages, and a transporting system including the storage, wherein the storage can unload and load a load efficiently by use of a relatively simple structure, or which can transport a load in the storage efficiently.

The above object of the present invention can be achieved by a storage for unloading and loading a load with a transporting carriage, comprising: a port capable of transferring said load from or to said transporting carriage; a plurality of rack portions capable of accommodating or putting said load thereon; a driving device capable of moving said load between said port and said plurality of rack portions, and mutually between said plurality of rack portions; and a controlling device for controlling said driving device to (i) firstly move said load to an temporary rack portion for unloading, which is one of said plurality of rack portions, and (ii), after once accommodating or putting said load on said temporary rack portion, move said load to said port from said temporary rack portion, in case of moving said load from said plurality of rack portions to said port.

According to the storage in the present invention, when loading, for example, a load is transported to a port by a transporting carriage which travels on a track. Then, the load is transferred from the stopped transporting carriage to the port of the storage. The load is moved from the port to a desired rack portion by a driving device including a vertical driving portion and a horizontal driving portion for example, that is, the load is transported in the storage.

When unloading, the load to be unloaded is transported in the storage from one rack portion desired among a plurality of or a lot of the rack portions, by the driving device.

Here, in a typical or traditional storage, as soon as a load is transported from a rack to a port by a stacker robot or the like, the transporting carriage having no load is called into the storage, the load is transferred from the port to the called transporting carriage without no load. Or letting the transporting carriage wait, which arrives at the port and has no load, and then as soon as the load is transported in the storage, the load is transferred from the port to the transporting carriage. In the former case, after the load is put onto the port, if the transporting carriage trying to transfer the load to the port arrives, it necessitates changes in the transportation plan. In the latter case, during the transportation in the storage, the transporting carriage waits at the port. Especially, if the storage is a large scale stocker, and if the distance of the transportation in the storage is long, a certain time period is extremely long until transferring the load to the transporting carriage. Otherwise, in the case of the stocker having such a simple construction that a rack stage capable of going up and down is a port as it is, during a certain time period of the transfer, the transportation in the storage is impossible.

On the contrary, according to the present invention, in the case of transporting a load in the storage from a rack portion to a port, firstly, under the control by a controlling device, by a driving device, the load is moved to the one temporary rack portion for unloading, of a plurality of rack portions. The load is accommodated or put temporarily on the temporary rack portion for unloading. Therefore, at this point, the port is not occupied by the load moved to the temporary rack portion. That is, at this point, there is a high possibility that the port is empty and is ready for loading. Subsequently, typically, the transporting carriage having no load arrives at the empty port. Or the port is empty and the transporting carriage having no load waits at the port, by transferring the load from the transporting carriage to the port and transporting the transferred load in the storage by the driving device. In one of two cases, by the driving device, the load, which is accommodated or put temporarily on the temporary rack portion for unloading, is moved from the temporary rack portion for unloading to the port. Then the load is transported from this storage to the transporting carriage.

As mentioned above, the port and the temporary rack portion for unloading are two different things. Thus, the operation of transferring a load onto the port, and the operation of transporting a load onto the temporary rack portion for unloading in the storage by the driving device, can be performed concurrently or simultaneously. Therefore, the operation efficiency, in which the operation of transferring and the operation of transporting in the storage are combined together, is dramatically advanced. Of course, in the present invention, for example, unlike in the case of using the rack stage capable of going up and down as a port, the port and the driving device are also two different things. Thus, during the operation of transferring at the port, the operation of transporting in the storage by the driving device, which is unrelated to the temporary rack portion for unloading, (e.g., during the operation of transferring, the operation of transporting the load between any rack portions in the storage, or the like) can be performed.

Further, transporting in the storage to the temporary rack portion for unloading, prior to transferring to the transporting carriage at such a port, may be performed with respect to any loads or any conditions. In this case, the control of transporting to the port and transporting in the storage to the temporary rack portion for unloading, is easily done. Or the transporting in the storage to the temporary rack portion for unloading may be performed with respect to some loads (e.g., loads on the rack portion being relatively far way from the port inside the storage) or under some conditions (e.g., conditions that the port is not expected to be used for unloading other load, or the like). In this case, although the control may be somewhat complicated, it is still possible to enhance the comprehensive efficiency of the operation of transferring and the operation of transporting in the storage.

As described above, according to the storage related to the present invention, unloading and loading a load, or transporting a load in the storage can be performed more efficiently by simple structure.

In another aspect of the storage of the present invention, said temporary rack portion for unloading is set as one from which it takes comparatively short time period to move said load onto said port, among said plurality of rack portions.

According to this aspect, it is possible to shorten a certain time period to transport the load from the temporary rack portion for unloading, to the port. It is possible to further enhance the efficiency of all the operations of transferring and transporting in the storage. The "comparatively short" here means that the time period is short as compared with at least the case of transporting from each of rack portions which are objects to perform transporting the load to the temporary rack portion for unloading, before transporting the load to the port in the storage. Ideally, the "comparatively short" means the minimum time period to move the load to the port. The "comparatively short" may mean the vicinity of such a minimum time period. If the time period is shorter than the average time period taken to move the load from all the rack portions to the temporary rack portion, effects reasonable in the present invention can be acquired.

In another aspect of the storage of the present invention, said controlling device controls said driving device to move said load from said temporary rack portion for unloading onto said port, if said transporting carriage has arrived or is to arrive at said port without said load, or if said transporting carriage waits at said port without said load.

In this aspect, under the control by a controlling device, by a driving device, the load which is accommodated, or stored or kept temporarily on the temporary rack portion for unloading, is moved onto the port, if the transporting carriage has arrived or is to arrive at the port without the load. The "has arrived" here corresponds to the time after the arrival of the transporting carriage is detected. The "is to arrive" here means the arrival is previously guessed or estimated, or planed. Or the load which is accommodated, or stored or kept temporarily on the temporary rack portion for unloading, is moved to the port, if the transporting carriage waits at the port without the load. The "the transporting carriage without the load" here means the condition of arriving without the load, and may mean the condition of becoming the transporting carriage without the load, by transferring the load to the port after arriving. In this manner, if transporting the load from the temporary rack portion for unloading to the port, transporting the load from the temporary rack portion for unloading to the port in the storage, is performed at the time that transferring to the transporting carriage is possible instantly. Thus, it is possible to practically make as little as possible the time period or the time ratio that the port is occupied or used by the load which is transported from the temporary rack portion for unloading.

In another aspect of the storage of the present invention, (i) said driving device comprises: a putting portion having a first putting surface capable of supporting said load from bottom side of said load; a horizontal driving portion capable of moving said putting portion back and forth in a horizontal one direction; and a vertical driving portion capable of moving said putting portion back and forth in a vertical direction, (ii) said plurality of rack portions has second putting surfaces respectively, one or plurality of said second putting surfaces being provided at a horizontal position accessible by said horizontal driving portion for each stage over a plurality of stages in the horizontal direction, and being constructed such that said load can be transferred between said first putting surface and respective one of said second putting surfaces, (iii) at least one of said plurality of rack portions functions as said port, and (iv) said temporary rack portion for unloading is located at the same stage of said port.

In this aspect, the rack has a plurality of rack portions in the horizontal one direction, in each of plural stages arranged in the vertical direction. Corresponding to the rack like this, the driving device can move a load back and forth in the horizontal one direction and in the vertical direction. Therefore, by moving in the 2 axes of the vertical direction and the horizontal one direction, it is possible to transport a load in the storage from the port for unloading and loading (or another rack portion) to the one rack portion desired among the rack portions which exist in the rack. Otherwise, by moving in the 2 axes of the vertical direction and the horizontal one direction, it is possible to transport a load in the storage from the one rack portion desired among the rack portions which exist in the rack to the port for unloading and loading (or other rack portion).

In each of the storages, for example, there are "m" (in this regard, "m" is a natural number of more than two) stages in the vertical direction, "n" (in this regard, "n" is a natural number of more than one) lines in the horizontal one direction, and only one line in another horizontal one direction (as below, which is simply called as the "thickness direction") which is perpendicular to the "n" line. In that manner, the structure of the whole rack is formed into a thin flat plate shape.

When loading, for example, the load is transferred from the transporting carriage onto the second putting surface which functions as the port for unloading and loading. Subsequently, the load transferred onto the second putting surface which functions as the port, is put on the first putting surface in the putting portion which can move in the two axes directions. For example, the first putting surface and the second putting surface are configured respectively to support each different part (typically, the central part and the surrounding part) in the bottom surface of a load. Either the first putting surface or the second putting surface can support the load. When the putting portion is moved to the vertical position and the horizontal position where the second putting surface which functions as the port exists, the load is supported on the first putting surface in place of the second putting surface which functions as the port. Then transferring from the second putting surface to the first putting surface is performed. Typically, the first putting surface is moved to be higher than the second putting surface by the vertical driving portion. By this moving, the load is supported on the first putting surface. Herewith, the transportation in the storage when loading is begun. Here, by the simple operation in the two axes by the vertical driving portion and the horizontal driving portion, the transportation in the storage can be performed rapidly to any second putting surface in the rack.

Subsequently, when the putting portion is moved to the vertical position and the horizontal position where the second putting surface which will be used for keeping exists, a load is supported on the second putting surface in place of the first putting surface. Then transferring from the first putting surface to the second putting surface is performed. Typically, the first putting surface is moved to be lower than the second putting surface by the vertical driving portion. By this moving, the load is supported on the second putting surface. Herewith, the transportation in the storage when loading is finished, and the keeping in the rack is started.

The above operation of loading is performed in the same way as in the case of transporting a load in the storage from the port to the temporary rack portion for unloading.

Otherwise, when unloading, the putting portion is moved to the vertical position and the horizontal position where the second putting surface supports a load which will be unloaded exists. Subsequently, the load is supported on the first putting surface in place of the second putting surface. Then the transferring from the second putting surface to the first putting surface is performed. Typically, the first putting surface is moved to be higher than the second putting surface by the vertical driving portion. By this moving, the load is supported on the first putting surface. Herewith, the transportation in the storage when unloading is started. Subsequently, the putting portion is moved to the vertical position and the horizontal position where the second putting surface which functions as the port exists. Here, by the simple operation in the two axes by the vertical driving portion and the horizontal driving portion, the transportation in the storage can be performed rapidly from any second putting surface in the rack.

Subsequently, the load is supported on the second putting surface which functions as the port in place of the first putting surface. Then the transferring from the first putting surface to the second putting surface which functions as the port is performed. Typically, the first putting surface is moved to be lower than the second putting surface by the vertical driving portion. By this moving, the load is supported on the second putting surface. Herewith, the transportation in the storage when unloading is finished and transferring from the port to the transporting carriage can be performed.

The above operation of unloading is performed in the same way, either as in the case of transporting in the storage from the temporary rack portion for unloading to the port, or as in the case of transporting in the storage from the usual rack portion which is not the temporary rack portion for unloading to the port, or as in the case of transporting in the storage from the usual rack portion to the temporary rack portion.

After that, transferring from the port to the transporting carriage is performed by the transporting carriage which is already waiting at the position on the track corresponding to the port for unloading and loading, or by the next transporting carriage which will come to this position.

Here, especially, the temporary rack portion for unloading is located at the same stage of the port. Thus, moving a load from the temporary rack portion for unloading to the port can be performed simply and rapidly by moving in the horizontal one direction by the horizontal driving portion Therefore, the operation of the temporary unloading is performed extremely efficiently by the putting portion which moves in the two axes directions.

As the result of the described above, the transportation in the storage from the temporary rack portion for unloading to the port (i.e., an operation of a temporary unloading or an operation of a temporary unloading), and the transportation in the storage from the port to all the rack portions can be performed by the relatively easy structure and control of the putting portion which moves in the two axes directions by the driving portion. Additionally, the transportation in the storage by the driving portion also can be performed during transferring between a transporting carriage and the port, the transporting efficiency in the storage is also dramatically advanced.

Further, typically, one among two of the rack portions at the same stage functions as the port. The other functions as the temporary rack portion for unloading. Or one among three of the rack portions at the same stage may function as the port, while the other two may function as the temporary rack portions for unloading. Then, moving a load between the temporary rack portion for unloading and the port can be possible by moving simply and rapidly in the horizontal one direction by the horizontal driving portion.

The above object of the present invention can be achieved by a storage set assembled by a plurality of storages each being a storage for unloading and loading a load with a transporting carriage, comprising: a port capable of transferring said load from or to said transporting carriage; a plurality of rack portions capable of accommodating or putting said load thereon; a driving device capable of moving said load between said port and said plurality of rack portions, and mutually between said plurality of rack portions; and a controlling device for controlling said driving device to (i) firstly move said load to an temporary rack portion for unloading, which is one of said plurality of rack portions, and (ii), after once accommodating or putting said load on said temporary rack portion, move said load to said port from said temporary rack portion, in case of moving said load from said plurality of rack portions to said port, said plurality of storages are arranged in such a manner that ports in said storages are arranged in one line.

According to the storage set in the present invention, the storage set has the storage or the other storage (in this regard, including its various aspects) of the present invention described above. Thus, unloading and loading a load, or transporting a load in the storage can be performed more efficiently by simple structure.

Above that, by inserting the storage of the present invention, into the space between various equipments and the like in the direction of a track installed in the factory, the storage can be arranged, the arranging is extremely useful. In other words, even if the layout includes some spaces opened to the air between the equipments and the like installed along a track, some spaces can become a tolerance enough by using the storage in the present invention. Additionally, by moving in the two axes to the rack including the rack portions which are spread thinly in the thickness direction as described above, that is, which exist in each of the stages, the transporting in the storage is performed extremely efficiently.

The above object of the present invention can be achieved by a transporting system with a storage, comprising: said transporting carriage; and a track along which said transporting carriage travels.

According to the transporting system of the present invention, the transporting system has the storage of the present invention described above. Thus, unloading and loading a load, or transporting a load in the storage can be performed more efficiently by simple structure.

The effect and other profit in the present invention are clarified from a best mode or embodiments to perform. The best mode or embodiments are described as follows.

DETAILED DESCRIPTION OF THE PREFERRED EMBODIMENTS

Figure 1:
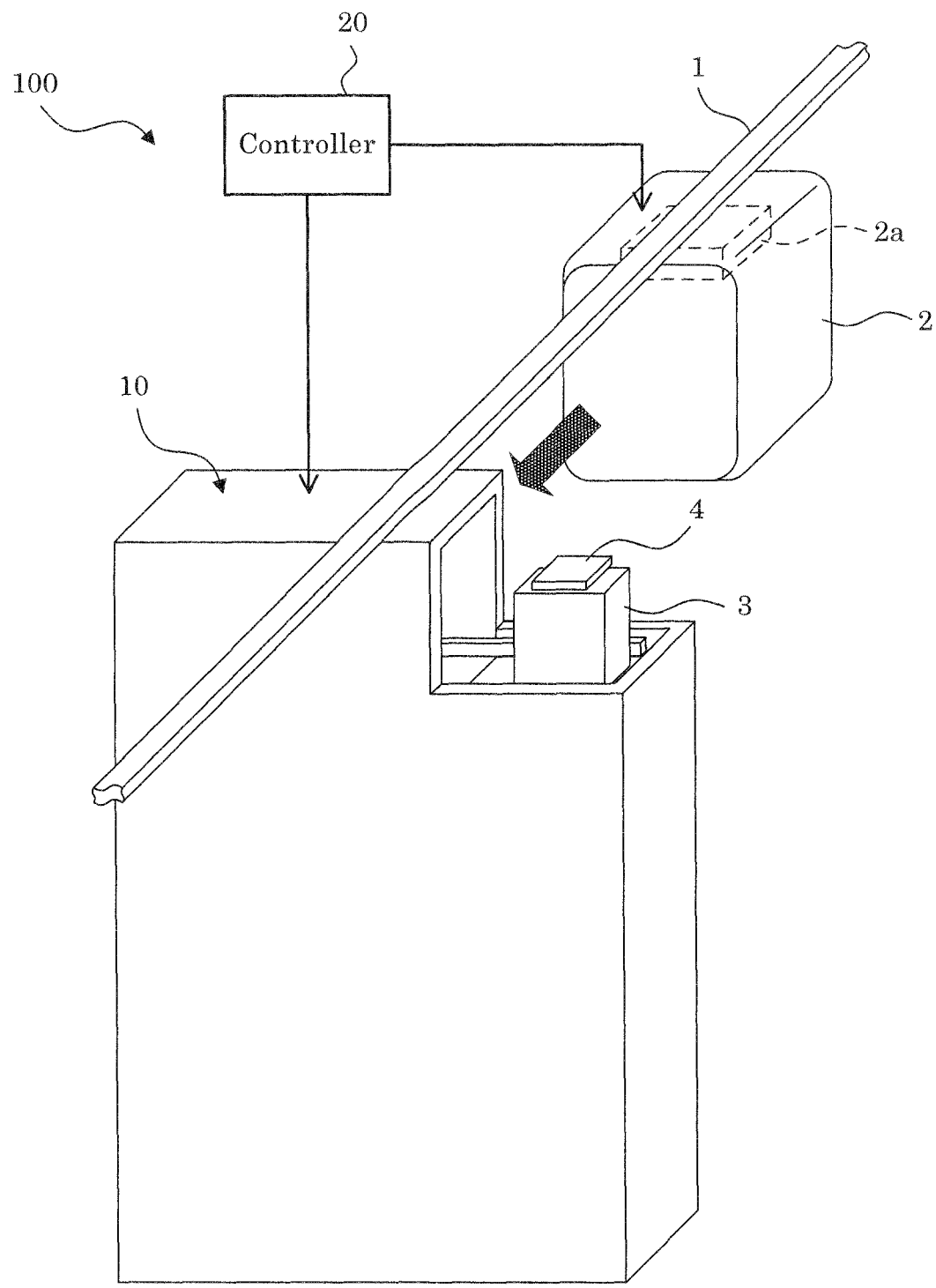
FIG. 1 is a perspective view showing an appearance of a transporting system including a storage, in the first embodiment of the present invention.
Figure 2:
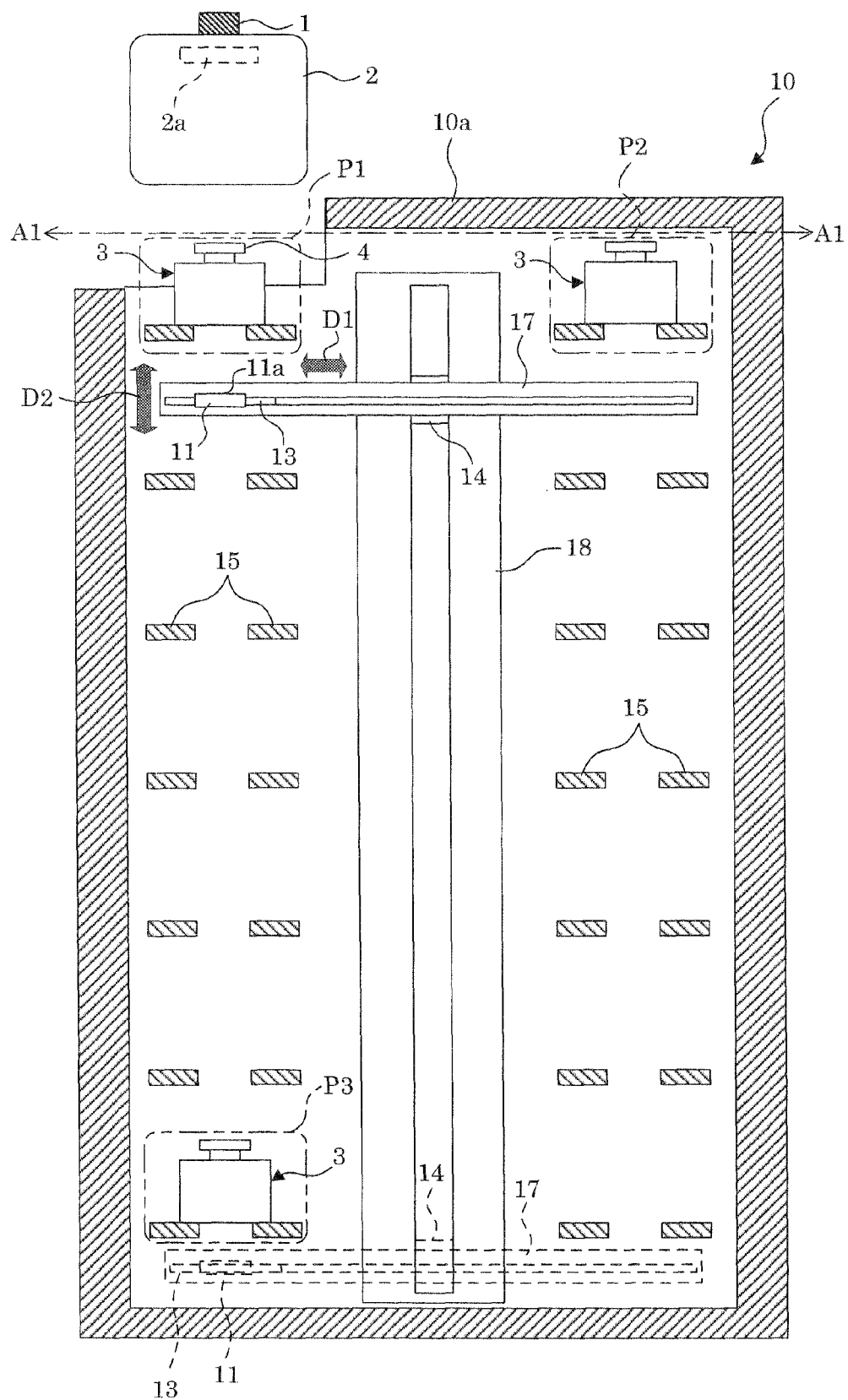
FIG. 2 is a cross sectional view showing an internal construction of the storage shown in FIG. 1.
Figure 3A:
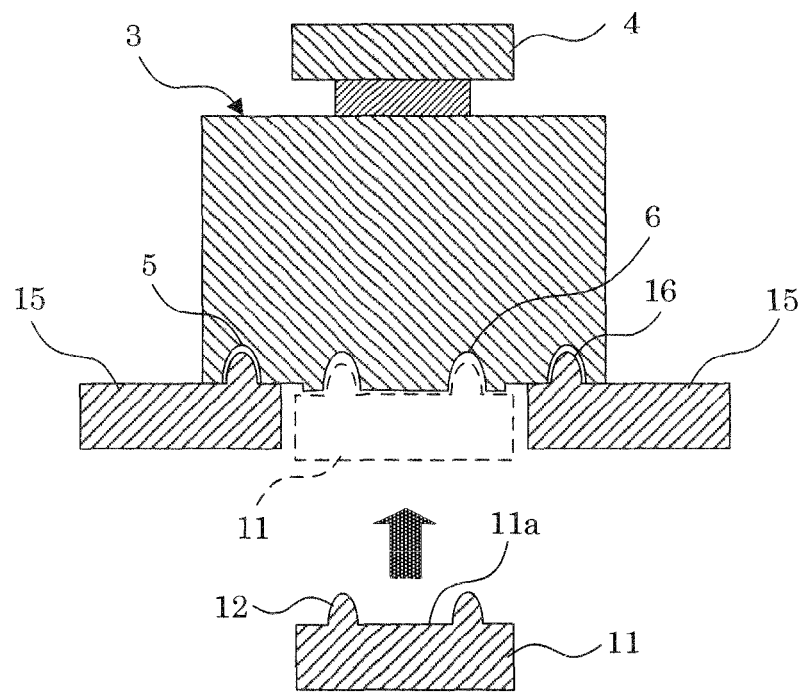
FIG. 3A is a cross sectional view showing an engaging condition of the first and second putting surfaces, in the first embodiment in one state.
Figure 3B:
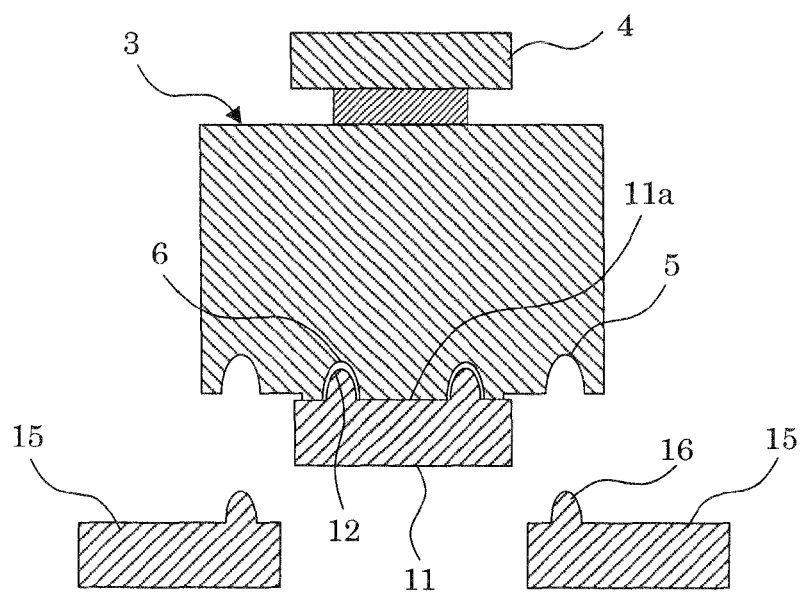
FIG. 3B is a cross sectional view showing an engaging condition of the first and second putting surfaces, in the first embodiment in another state.

Referring to the accompanying drawings, an embodiment of the present invention will be now explained.
<First Embodiment>
At first, the structure of the storage in the first embodiment will be explained referring to FIG. 1 to FIG. 3B. FIG. 1 shows an appearance of a transporting system including a storage in the first embodiment, FIG. 2 shows the internal construction of the storage shown in FIG. 1, and each of FIG. 3A and FIG. 3B shows an engagement condition of the first and second putting surfaces in the first embodiment, with respect to a load.

In FIG. 1, a transporting system 100 is provided with a rail 1, a transporting carriage 2, a stocker (which is one example of the "storage" of the present invention) and a controller 20. The transporting system 100 drives the transporting carriage 2, and then performs transporting a FOUP 3 on the rail 1. The rail 1, which is an example of the "track" of the present invention, functions as a track for the transporting carriage 2 to travel thereon.

The transporting carriage 2 is the OHT (Overhead Hoist Transport) driven by, for example, a linear motor and transports the FOUP 3 to the stocker 10, a manufacturing equipment not shown, an OHT buffer, a large scale stocker, and the like. The transporting carriage 2 includes internally a hoist 2a which moves in the vertical direction.

Upon transporting, the hoist 2a holds a flange 4 of the FOUP 3 which is to be transported, by a holding mechanism for example. The hoist 2a is constructed to be able to move down and up in the vertical direction below the rail 1 by a hoisting mechanism such as a taking up and down belt and the like. Upon unloading or loading the FOUP 3 with the stocker 10, the hoist 2a moves to the position above a port for unloading and loading of the stocker 10. At the position where the hoist 2a moves down to the port, the hoist 2a holds or releases the flange 4. At this position, the bottom surface of the FOUP 3 contacts with the second putting surface (i.e., the floor surface of the port) described later.

As shown in FIG. 1 and FIG. 2, the FOUP 3, which is an example of "a load" of the present invention, is transported for unloading and loading with respect to the transporting carriage 2 (i.e., is transported in the storage) and for the adjustment of the storing position and so on.

As shown in FIG. 3A and FIG. 3B, the FOUP 3 has concave parts 5, 6 on the bottom surface. The concave part 5 is formed to have the size corresponding to a convex part 16 constructed in the rack 15 described later. On the other hand, the concave part 6 is formed to have the size corresponding to a convex part 12 constructed in a putting part 11 described later.

In FIG. 1 again, on the basis of the process schedule of a semiconductor device manufacturing for example, the controller 20 orders the transporting carriage 2 and the stocker 10 to transport, unload and load (which includes the transporting in the storage) the FOUP 3. In response to this order, the transporting carriage 2 and the stocker 10 are driven, the FOUP 3 is transported by the transporting carriage 2 and various processes is applied to the transported FOUP 3, so that the semiconductor device is manufactured.

(Storage Simple)

The stocker 10 is an example of "a storage" of the present invention, is installed in adjacent to the rail 1 and stores a plurality of FOUPs 3.

In FIG. 2, the stocker 10 has: an in-storage transporting equipment including a putting portion 11, a horizontal driving portion 13 and a vertical driving portion 14; and a plurality of racks 15. The in-storage transporting equipment transfers the FOUP 3 between the racks 15. By this transferring, the FOUP 3 is put on the intended rack (i.e., a rack for storing or keeping) among the racks 15. Thus the FOUP 3 is stored in the stocker 10. Alternatively, as described later in detail, the FOUP 3 is transferred to a rack 15 which functions as a port for unloading and loading.

In order to transfer the FOUP 3 between the racks 15, the putting portion 11 is moved in the horizontal one direction by the horizontal driving portion 13, and is moved in the vertical direction by the vertical driving portion 14. The putting portion 11 has a first putting surface 11a at the top surface thereof. When transferring, the first putting surface 11a contacts with the bottom surface of the FOUP 3, and supports the FOUP 3 from its bottom side. On the first putting surface 11a, the convex part 12 is formed as a supporting component. As shown in FIG. 3B, the convex part 12 is formed to have the size corresponding to the concave part 6 of the FOUP 3. When transferring, the convex part 12 is engaged to this concave part 6.

In FIG. 2 again, the horizontal driving portion 13 is driven on a horizontal guide 17 which extends in the horizontal one direction by a motor not illustrated for example. The horizontal driving portion 13 is connected with the putting portion 11 and moves back and forth the putting portion 11 along the horizontal guide 17 in the horizontal one direction D1.

The vertical driving portion 14 is driven on a vertical guide 18 which extends in the vertical direction by a motor not illustrated for example. To the vertical driving portion 14, the center portion of the horizontal guide 17 is fixed. The vertical driving portion 14 moves back and forth the horizontal gyide 17 along the vertical guide 18 in a vertical direction D2. When moving back and forth, the putting portion 11 is located at the center portion of the horizontal guide 17. In this manner, the putting portion 11 is moved in two axes direction of the vertical direction and the horizontal one direction by the horizontal driving portion 13 and the vertical driving portion 14.

The racks 15 is provided with total 14 racks of 7 stages in the vertical direction, 2 lines in the horizontal one direction and 1 line in the thickness direction. The putting portion 11 moves between these 14 racks 15. Then, transferring the FOUP 3 is performed. Each rack 15 has a second putting surface 15a on the top surface thereof. On this second putting surface 15a, the FOUP 3 is put. On the second putting surface 15a, a convex part 16 is formed as a supporting component. As shown in FIG. 3A, the convex part 16 is formed to have the size corresponding to the concave part 5 of the FOUP 3. When putting (as well as storing or keeping) the FOUP 3, the convex part 16 is engaged to this concave part 5.

In FIG. 2 again, one rack 15 among the 14 racks 15(in other words, the second putting surface 15a which the one rack 15 has) functions as the port for unloading and loading to transfer the FOUP 3 with the transporting carriage 2. The rack 15, which is set as the port, is one of two racks existing on the top stage (i.e., one rack 15 located in an area P1 shown by a two dot chain line in FIG. 2). The part of the main unit 10a of the stocker 10, located above and on the lateral side of the FOUP 3 which is put on this one rack 15, is opened so that the FOUP 3 can be unloaded and loaded there through.

Incidentally, not only one rack 15 set as a port, but also the putting portion 11 moved to the area P1 may be functioned as an additional port. Alternatively, the putting portion 11 may be functioned as the sole port instead of the one rack 15. In this case, while the rack 15 is not disposed in the area P1, the putting portion 11 on which the FOUP 3 is not put is disposed in the area P1. Then the FOUP 3 is directly loaded from the transporting carriage 2 to the putting portion 11. Or when the putting portion 11 on which the FOUP 3 is put is disposed in the area P1, the FOUP 3 is directly unloaded to the transporting carriage 2 from the putting portion 11.

About the arrangement of the stocker 10, the rack 15 set as a port is arranged below the rail 1. In particular, the azimuth of the horizontal one direction in which the putting portion 11 is moved intersects perpendicularly to the azimuth of the rail 1.

Figure 4A:
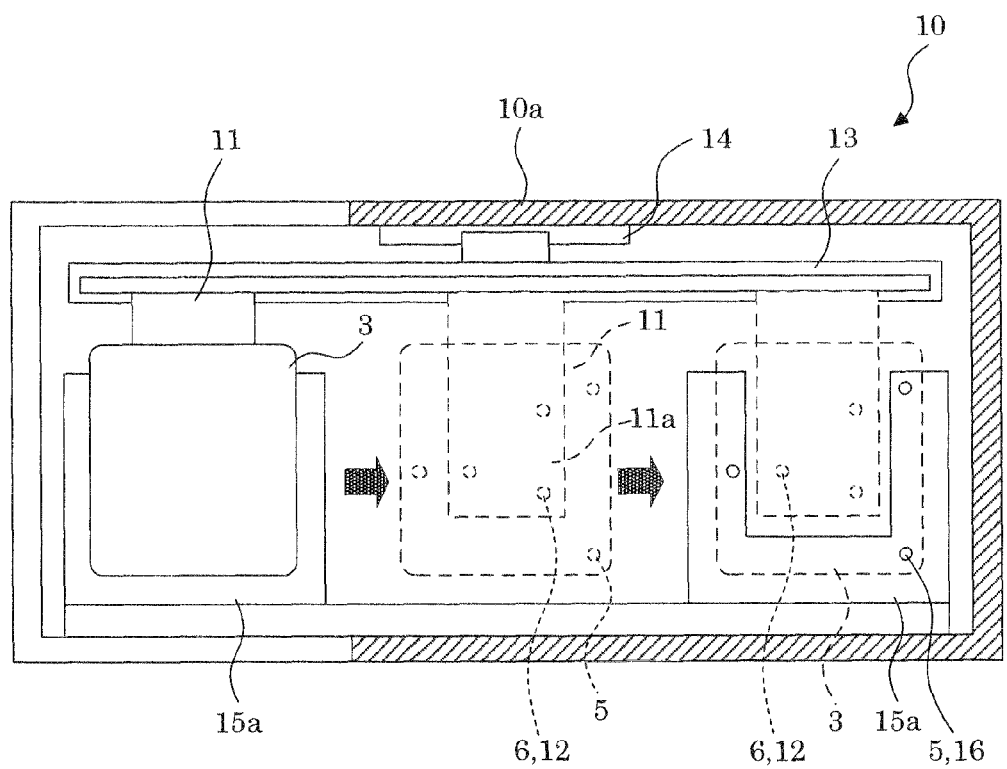
FIG. 4A is a plan view showing an operational condition in the horizontal one direction of a putting portion, in the embodiment of the present invention in one concrete example.

Next, referring to FIG. 4A, the figure of the first and second putting surfaces related to this embodiment will be explained. Here, FIG. 4A is a plan view shown a condition that the putting portion related to this embodiment moves in the horizontal one direction. In particularly, FIG. 4A corresponds to the A1-A1 cross section of FIG. 2 and shows two lines of the racks 15 (i.e., the second putting surface 15a) set at the top stage in the stocker 10.

As shown in FIG. 4A, when seen from above the stocker 10, the second putting surface 15a is formed into a U character like a horseshoe, and the first putting surface 11a is formed into a square like an island to occupy the center of the U character. Therefore the first putting surface 11a and the second putting surfaces 15a have respectively a flat shape complemented by each other. Between the first putting surface 11a and the second putting surfaces 15a like this, transferring the FOUP 3 is performed.

Figure 4B:
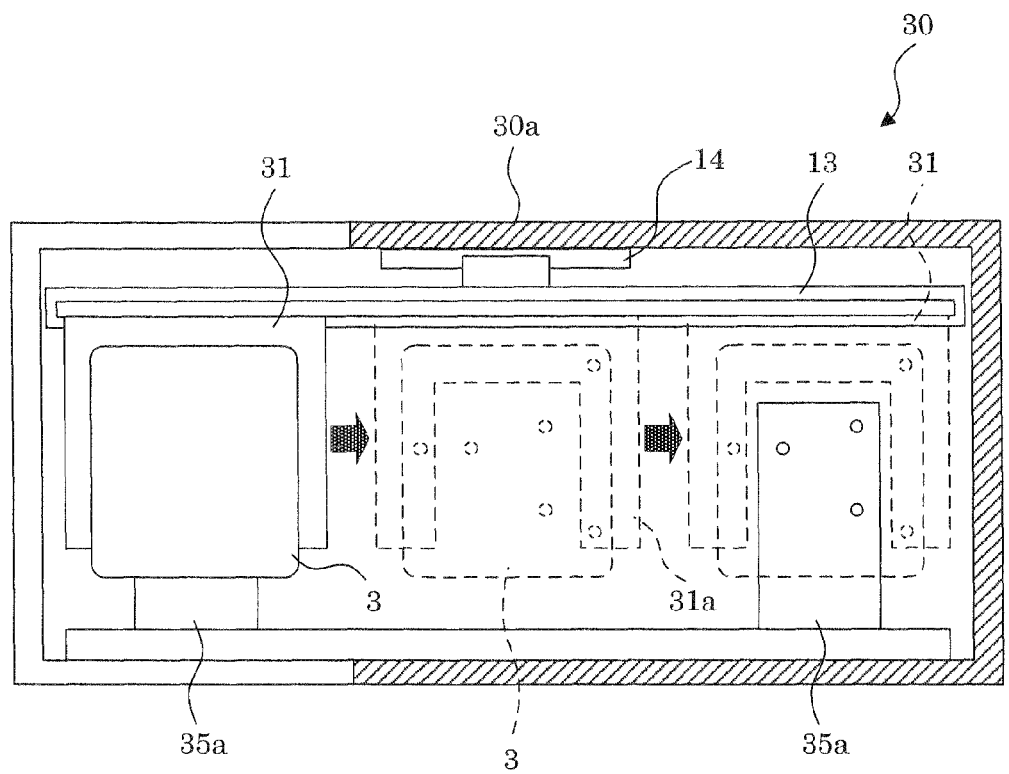
FIG. 4B is a plan view showing an operational condition in the horizontal one direction of a putting portion, in the embodiment of the present invention in a modified example.

Incidentally, in the example shown in FIG. 3A and FIG. 3B as well as FIG. 4A, when plainly seen, the first putting surface 11a lies inside the second putting surface 15a, the external diameter of the first putting surface 11a is smaller than that of the second putting surface 15a. However, conversely, the first putting surface 11a and the second putting surface 15a may be constructed such that the first putting surface 11a lies outside the second putting surface 15a, the external diameter of the first putting surface 11a is larger than that of the second putting surface 15a. In this case, as a modified example of the figures of the first putting surface 11a and the second putting surface 15a shown in FIG. 4A, as shown in FIG. 4B for example, when seen from above the stocker 30, the first putting surface 31a is formed into a U character like a horseshoe, and the second putting surface 35a is formed into a square like an island to occupy the center of the U character. In this manner, if the first putting surface 31a moved in the left and right and the up and down directions is made larger, the safety on the occasion of transportation in the storage while the FOUP 3 is put on the putting portion 31, is increased. This is helpful to prevent drop and jounce of the FOUP 3.

(In-storage Transporting Operation)

Next, referring to the drawings still from FIG. 2 to FIG. 4B, transferring the load in the storage related to this embodiment, that is, the operation of in-storage transporting (i.e., the transporting within the storage) is explained.

In FIG. 2 as well as FIG. 4A and FIG. 4B, the FOUP 3, which is loaded by the transporting carriage 2 and is putting on one second putting surface 15a in the area P1, is transferred to another second putting surface 15a (that is, in FIG. 2 as well as FIG. 4A and FIG. 4B, it shown in an area P2) in the same stage. In this case, first, the putting portion 11, (which is shown by the broken line in FIG. 2) which has finished transporting the FOUP 3 onto the second putting surface 15a in an area P3, is moved just under the second putting surface 15a in the area P1. At this occasion, the putting portion 11 is moved to an approximate center of the horizontal guide 17 by the horizontal driving portion 13, and after that, the putting portion 11 is moved to the predetermined vertical position along the vertical guide 18 by the vertical driving portion 14. This predetermined vertical position is below the second putting surface 15a in the area P1. After that, the putting portion 11, existing at the predetermined vertical position, is moved to the predetermined horizontal position (which is shown by the solid line in FIG. 2) along the horizontal guide 17 by the horizontal driving portion 13. As shown in FIG. 3A, this predetermined horizontal position is a position where the convex part 12 of the putting portion 11 exists on the lower side in the vertical direction of the concave part 6 of a FOUP 3.

The putting portion 11, which has been moved to the predetermined vertical position and horizontal position, is then moved upwards by the vertical driving portion 14. By moving upwards, the first putting surface 11a passes through the center of the second putting surface 15a. Then, as shown in FIG. 3B, the first putting surface 11a becomes higher than the second putting surface 15a. At this time, the engagement of the concave part 5 and the convex part 16 is disengaged. Then, in place of the second putting surface 15a, the FOUP 3 is supported on the first putting surface 11a, and the convex part 12 of the putting portion 11 and the concave part 6 of the FOUP 3 are engaged with each other. Thus the FOUP 3 is transferred from the second putting surface 15a to the first putting surface 11a.

The putting portion 11 on which the FOUP 3 has been transferred is moved right above the second putting surface 15a in the area P2. At this occasion, the putting portion 11 is moved to the predetermined horizontal position in the horizontal one direction by the horizontal driving portion 13. The predetermined horizontal position is a position where the concave part 5 of the FOUP 3 exists on the upper side in the vertical direction of the convex part 16 of the second putting surface 15a in the area P2. The putting portion 11, which has been moved to the predetermined horizontal position, is moved downwards by the vertical driving portion 14. By moving downwards, the first putting surface 11a passes through the center of the second putting surface 15a in the area P2. Then, as shown in FIG. 3A, the first putting surface 11a becomes lower than the second putting surface 15a. At this time, the engagement of the convex part 12 and the concave part 6 in the area P2 is disengaged. By this, the FOUP 3 is supported on the second putting surface 11a in place of the first putting surface 11a, and the concave part 5 of the FOUP 3 and the convex part 16 of the second putting surface 15a are engaged with each other. Thus the FOUP 3 is transferred from the first putting surface 11a to the second putting surface 15a in the area P2. For this reason, the operation of transferring of the FOUP 3 from the area P1, which is set as a port, to the area P2 is completed. Incidentally, if the operation of transferring is performed in the inverse process, transferring from the area P2 to the area P1 is operated. Therefore, the above described operation of transferring through the port is also the operation for unloading and loading the FOUP 3 between the transporting carriage 2 and the stocker 10.

As described above, according to the stocker 10 in this embodiment, the stocker 10 extends in the vertical direction and the horizontal one direction, and the stocker 10 is constructed extremely thin, including the space needed for the thickness of one FOUP 3 and the movement of the horizontal driving portion 13 and the vertical driving portion 14, in the thickness direction. For this reason, into an even relatively small space along the rail 1, the stocker 10 can be disposed. The putting portion 11 which moves in the 2 axes directions is not needed when unloading and loading between the port and the transporting carriage 2, and the putting portion 11 does not interfere the operation of unloading and loading. Thus it is possible to unload and load the FOUP 3 efficiently and is also possible to perform the in-storage transportation efficiently, by use of a simple structure.

Incidentally, in this embodiment, in the plurality of racks 15, one rack 15 on the top stage is set as the port for unloading and loading. Any of the racks 15 except this one rack 15 may be set as the port for temporarily unloading to store the FOUP 3 just before unloading, and the like.

<Second Embodiment>

Figure 5:
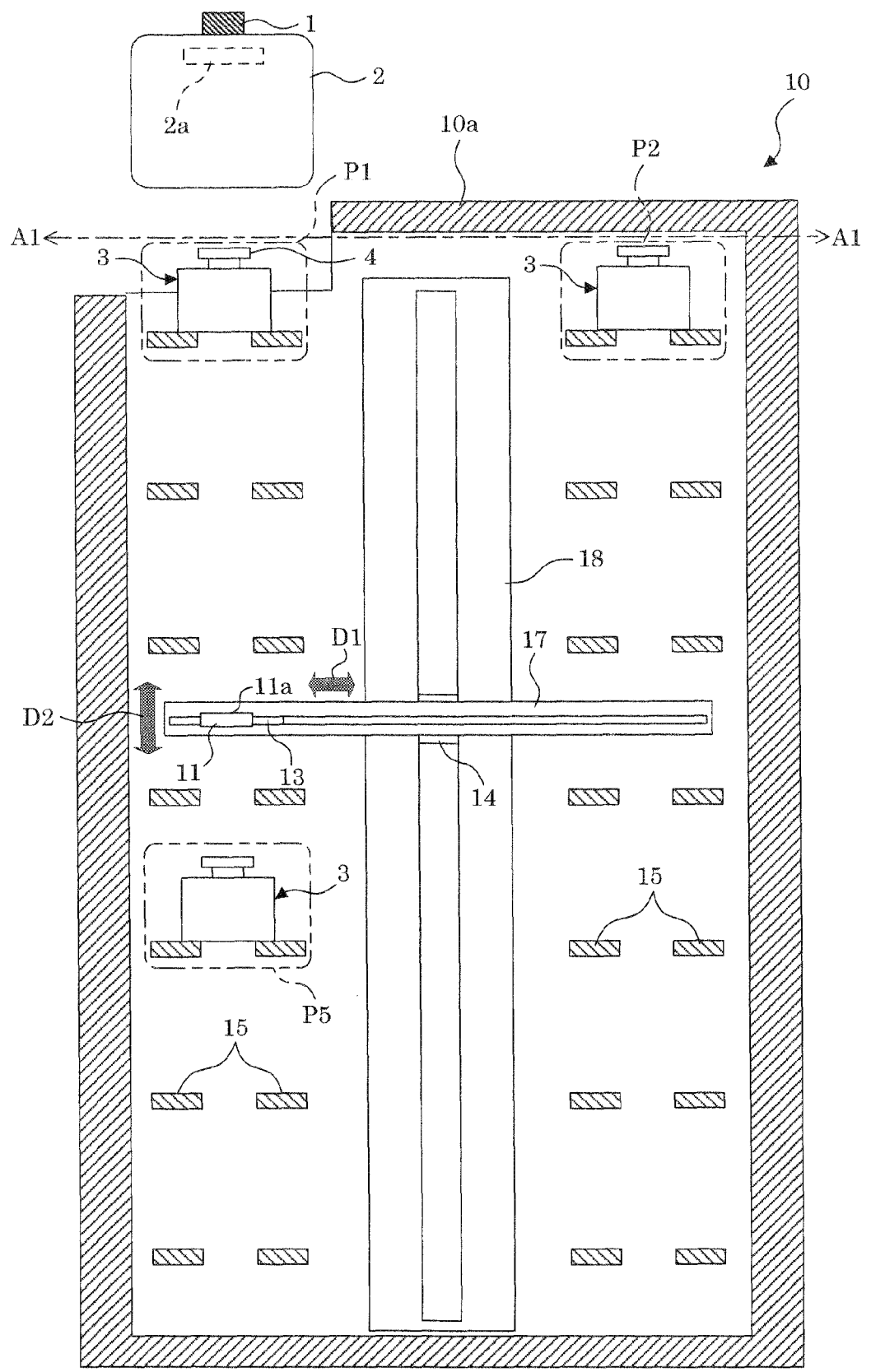
FIG. 5 is a cross sectional view showing an arrangement condition of rack portions, in the second embodiment of the present invention.

Next, as the second embodiment in this invention, the controlling device which controls the driving device related to the first embodiment is explained with referring to FIG. 5. Here, FIG. 5 is a cross sectional view showing an arrangement condition of the racks when the in-storage transporting related to the second embodiment, whose general purpose is the same as that of FIG. 2. In particular, the FIG. 5 shows the setting of the port for unloading and loading set in the first embodiment as well as that of the port for temporarily unloading (as below, which may be simply called as the "temporary port for unloading") (i.e., which is an example of "a temporary rack portion for unloading" of the present invention). Incidentally, in the transporting system shown in FIG. 5, the same constitutional elements as those in the transporting system 100 shown in FIG. 2 carry the same reference numerals and the explanations thereof are omitted.

In FIG. 5, in the same manner as the first embodiment, the rack 15 located in an area P1 of the racks 15 is set as the port for unloading and loading. Especially, in this embodiment, one rack 15 of the racks 15 except the rack 15 which is set as the port for unloading and loading, is set as the temporary port for unloading.

Before the FOUP 3 to be unloaded is transferred onto the port for unloading and loading (which is in the area P1), the temporary port for unloading plays a role in temporarily storing or keeping (as well as accommodating) the FOUP 3. Another of two racks 15 existing on the same top stage as the port for unloading and loading (that is, it located in the area P2 in FIG. 5) is set as the temporary port for unloading. When transferring from the temporary port for unloading which is located in the area P2 to the port for unloading and loading which is located in the area P1, the FOUP 3 is moved only in the horizontal one direction. For this reason, the time period to transfer it is short as compared with that to transfer from each of the racks located in any other area which is not the area P2, to the port for unloading and loading in the area P1.

In the same manner as the first embodiment, the horizontal driving portion 13 and the vertical driving portion 14 are controlled by the controller 20. The controller 20 selects one rack 15 to which the load is to be transferred among the plurality of racks 15 depending on the condition of unloading or loading, and performs transferring to the selected one rack 15. When unloading, the controller 20 moves the putting portion 11 so as to transfer the FOUP 3 which is stored or kept (as well as accommodated) for real on any of the rack 15 except the port for unloading and loading, and the temporary port for unloading (as below, which may be simply called as "a rack for storing or keeping"), to the temporary port for unloading (which is in the area P2) by the horizontal driving portion 13 and the vertical driving portion 14. After this moving, if the transporting carriage 2 for unloading has arrived at the port for unloading and loading, the controller 20 moves the putting portion 11 so as to transfer the FOUP 3 from the temporary port for unloading to the port for unloading and loading.

(In-storage Transporting Operation using a temporary port for unloading)

Figure 6:
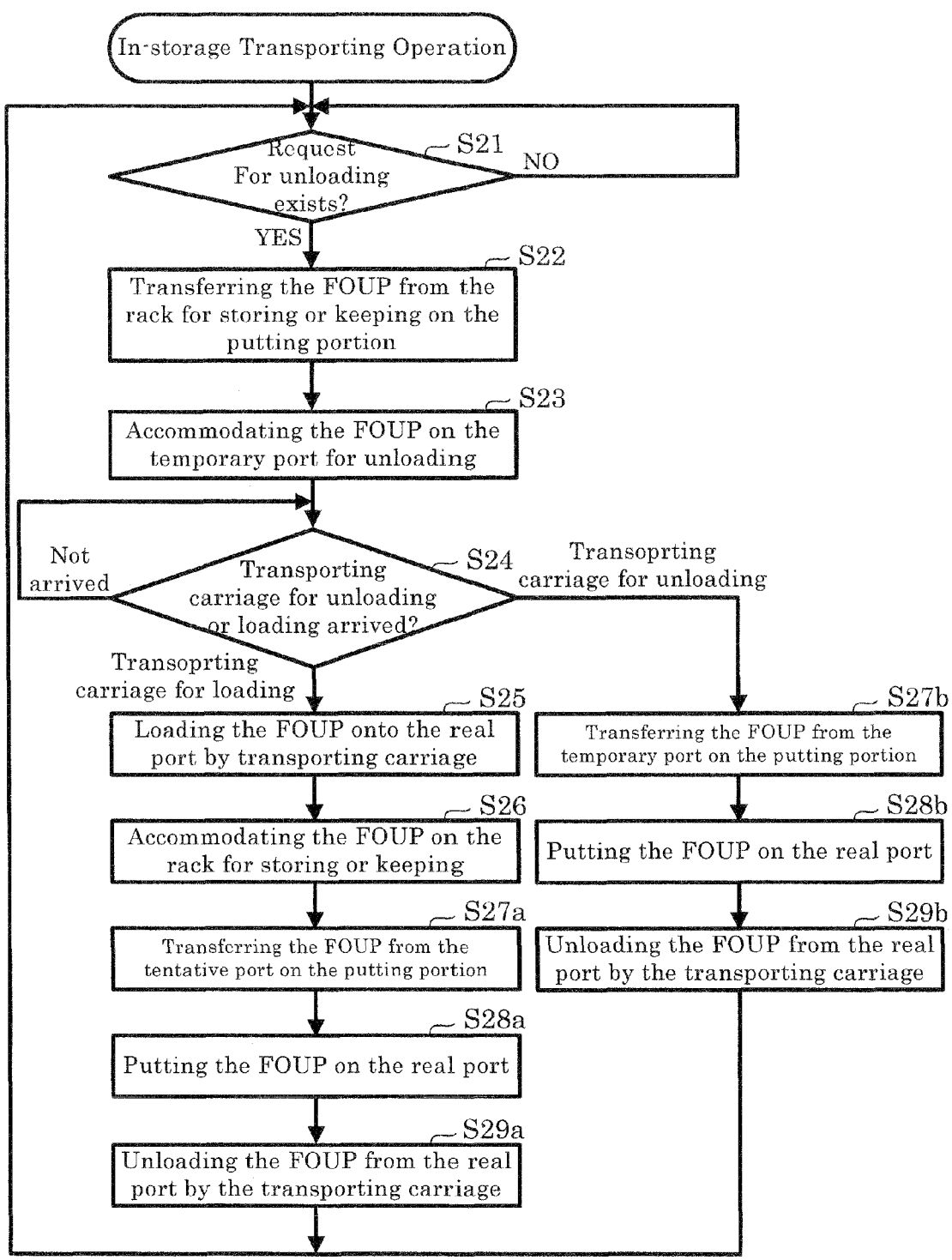
FIG. 6 is a flow chart showing a transporting process in a storage of a transporting system, in the second embodiment of the present invention.

Next, referring to FIG. 6, the operation of unloading using the temporary port for unloading, of operations of in-storage transporting (i.e., the transporting within the storage) related to the second embodiment is explained. Here, the FIG. 6 is a flow chart showing the operation of unloading.

In FIG. 6, first, by the controller 20, with respect to the stocker 10, it is judged whether a request for unloading exists or not (step S21). As the result of this judgment, if the request for unloading does not exist (NO: step S21), preparing so as to transfer the FOUP 3 to be unloaded onto the rack 15 of the temporary port for unloading is not performed. On the other hand, if the request for unloading exists (YES: step S21), the FOUP 3 which is put on the rack 15 for storing or keeping, is transferred on the first putting surface 11by moving of the putting portion 11 (step S22). Further, the putting portion 11 which is supporting the FOUP 3, is moved into the area P2. Then, the FOUP 3 is transferred (as well as accommodated) onto the temporary port for unloading (i.e., in the area P2) (step S23).

After this transferring, it is judged whether the transporting carriage 2 which has arrived at the port for unloading and loading, is for unloading or for loading is or not (step S24). As the result of this judgment, if the transporting carriage 2 is for unloading and has no load at the time of arrival ("Transporting carriage for unloading": step S24), the FOUP 3 which is accommodated on the temporary port for unloading 15 (which is in the area P2) is transferred on the first putting surface 11a by the movement of the putting portion 11 (step S27b). Further, the putting portion 11 which is supporting the FOUP 3, is moved into the area P1. Then, the FOUP 3 is transferred onto the port for unloading and loading (which is shown as the "real port" in FIG. 6) (step S28b). The FOUP 3 which is put in the area P1 is unloaded by the transporting carriage for unloading (step S29b).

On the other hand, as the result of the step S24, if the transporting carriage 2 is for loading and has a load at the time of arrival ("Transporting carriage for loading": step S24), the FOUP 3 is loaded by the transporting carriage 2 for loading. Then, the loaded FOUP 3 is put onto the port for unloading and loading (which is shown as the "real port" in FIG. 6) (step S25). Just after this putting, the FOUP 3 which is putting on the port for unloading and loading, is transferred onto the rack for storing or keeping (which is in the area P5) (step S26). After this transferring, operations of transferring, moving and transferring in the same way as these of from the steps S27b to S29b are performed with respect to the transporting carriage 2 without load (at the steps S27a, S28a and S29a). By these operations, the FOUP 3 to be unloaded is transferred to the transporting carriage 2.

Incidentally, after loading of the step S25, the transporting carriage 2 without load does not transfer the FOUP 3 which is put on the temporary port for unloading, but may travel toward other point on the rail 1 while having no load. In this case, in the stocker 10, it may be waited for that other transporting carriage 2 without load will arrive, or the arrived transporting carriage 2 will become empty (i.e., without load).

As mentioned above, according to the stocker 10 in this embodiment, as well as the port for unloading and loading, the temporary port for unloading is set. Then, the operation of unloading and loading a load on the port for unloading and loading, and the operation of the in-storage transporting related to the temporary port for unloading by the driving device, can be performed concurrently or simultaneously. Therefore, the operation efficiency including the operation of transferring and the operation of the in-storage transporting together, is dramatically advanced.

Incidentally, in this embodiment, in two areas P1 and P2 located on the top stage in the stocker 10, the area P1 is set as the port for unloading and loading, while the area P2 is set as the temporary port for unloading. The area P1 may be set as the port for unloading, the area P2 may be set as the port for unloading, and areas except that or those of the top stage may be set as the temporary port for unloading. Further, in this embodiment, the stocker 10 is disposed such that the azimuth of the horizontal one direction in which the putting portion 11 is moved intersects perpendicularly to the azimuth of the rail 1. The stocker 10 may be disposed such that the azimuth of the horizontal one direction is in parallel to the azimuth of the rail 1.

Figure 7:
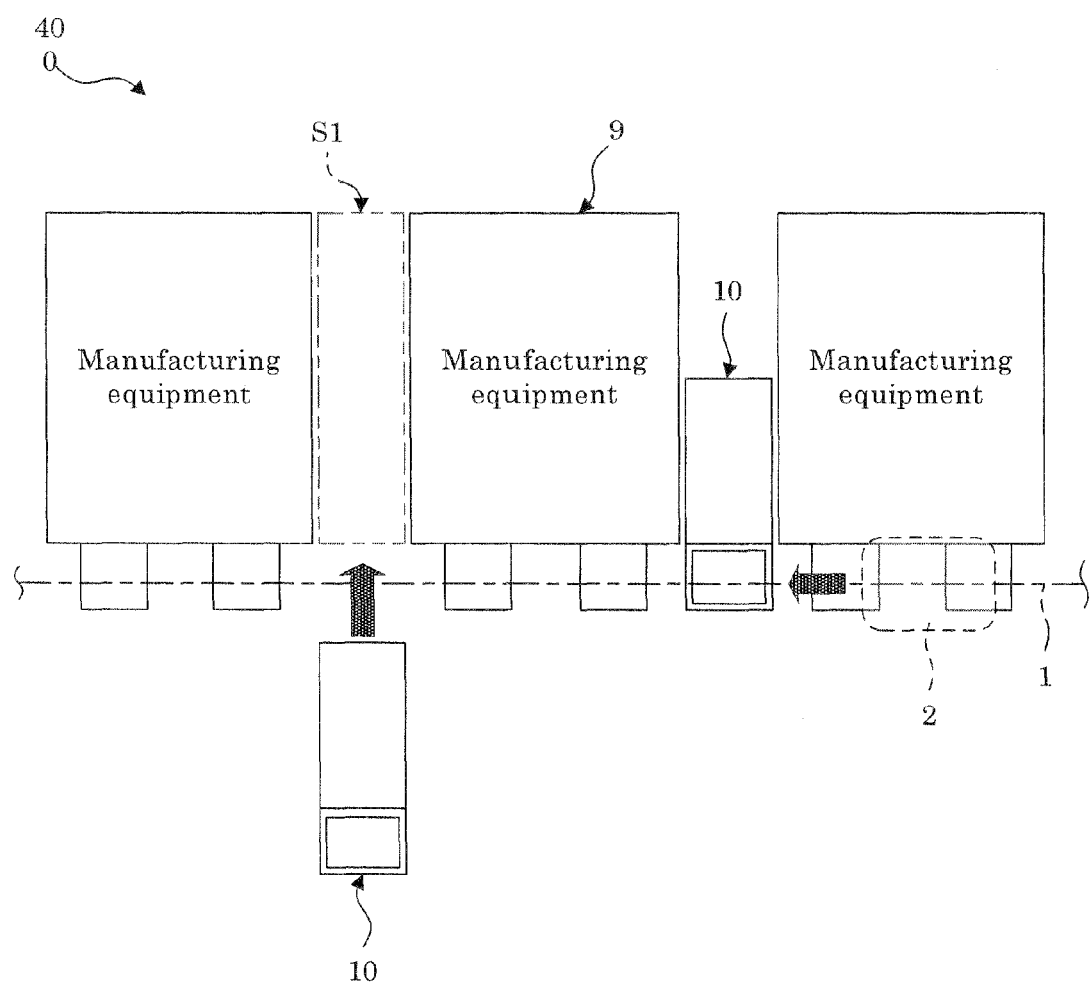
FIG. 7 is a plan view showing a practical arrangement condition of storages, in the first embodiment of the present invention.

Next, referring to FIG. 7, the arrangement of the storage is explained. Here, the FIG. 7 is a plan view showing a condition of arranging of storages in the first embodiment.

As shown in FIG. 7, the storage is arranged in the space between the manufacturing equipments, and the like, set along the track in the factory of, for example, a semiconductor manufacturing factory and the like. The size of the stocker 10 in the thickness direction is designed corresponding to the space (or gap) between the manufacturing equipments 9. Between the manufacturing equipments 9, the space S1 for maintenance is reserved. Inserting the stocker 10 into the space S1, the space S1, which may be called as a wasted space except the time of maintenance, is used effectively. The manufacturing equipments 9 and the stocker 10 arranged between these manufacturing equipments 9 are arranged with respect to the rail 1 in such a manner that the horizontal one direction, in which the putting portion is moved, perpendicularly crosses.

The present invention is not limited to the embodiments described above. The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and range of equivalency of the claims are therefore intended to be embraced therein.

The entire disclosures of Japanese Patent Application No. 2007-271382 filed on Oct. 18, 2007 including the specification, claims, drawings and summary are incorporated herein by reference in their entireties.

What is claimed is:

1. A transporting system with a storage, comprising:
a transporting carriage configured for unloading and loading a load with said storage, and which includes a hoist configured for holding a flange of the load;
a track along which said transporting carriage travels; and
a storage comprising:
   a port capable of transferring said load from or to said transporting carriage;
   a plurality of rack portions capable of accommodating or putting said load thereon;
   a driving device capable of moving said load between said port and said plurality of rack portions, and mutually between said plurality of rack portions;
   a main unit for covering said plurality of rack portions and said driving device, and an upper part of which is partially opened so that said load can be unloaded and loaded between said transporting carriage and said port; and
   a controlling device for controlling said driving device to (i) firstly move said load to an temporary rack portion for unloading, which is one of said plurality of rack portions, and (ii), after once accommodating or putting said load on said temporary rack portion, move said load to said port from said temporary rack portion, in case of moving said load from said plurality of rack portions to said port,
said storage arranged in such a manner that an azimuth of a horizontal one direction in which said driving device is moved intersects perpendicularly to an azimuth of said track,
said plurality of rack portions has two lines in said horizontal one direction and has only one line in an another horizontal one direction which is perpendicular to said horizontal one direction,
said port is located below said track along,
one of said plurality of rack portions, which is located at a top stage of a plurality of stages in one of the two lines, functions as said port, and
one of said plurality of rack portions, which is located at a same stage as said port in other of the two lines, functions as said temporary rack portion for unloading.

2. The transporting system with the storage according to claim 1, wherein
   (i) said driving device comprises:
      a putting portion having a first putting surface capable of supporting said load from bottom side of said load;
      a horizontal driving portion capable of moving said putting portion back and forth in said horizontal one direction; and
      a vertical driving portion capable of moving said putting portion back and forth in a vertical direction, and
   (ii) said plurality of rack portions has second putting surfaces respectively, one or plurality of said second putting surfaces being provided at a horizontal position accessible by said horizontal driving portion for each stage over a plurality of stages of the two lines in the horizontal direction, and being constructed such that said load can be transferred between said first putting surface and respective one of said second putting surfaces.

* * * * *